United States Patent [19]

Hoover et al.

[11] Patent Number: 4,898,759
[45] Date of Patent: Feb. 6, 1990

[54] MOLDED PRINTED CIRCUIT BOARD FOR USE WITH A BRUSHLESS ELECTRIC MOTOR

[75] Inventors: John W. Hoover, Huntington; Charles R. Marracino, Torrington, both of Conn.

[73] Assignee: Nidec Corporation, Torrington, Conn.

[21] Appl. No.: 225,090

[22] Filed: Jul. 27, 1988

[51] Int. Cl.$^4$ ............................................. B32B 3/00
[52] U.S. Cl. ................................. 428/99; 428/131; 428/137; 428/209; 428/901; 174/250; 264/104; 361/397
[58] Field of Search .................. 174/68.5; 264/104; 428/131, 137, 209, 99, 901; 361/397

[56] References Cited

U.S. PATENT DOCUMENTS

| | | | |
|---|---|---|---|
| 3,191,135 | 6/1965 | Hazelquist | 336/65 |
| 3,596,139 | 7/1971 | Walsh | 174/68.5 |
| 4,003,128 | 1/1977 | Dochterman | 29/596 |
| 4,099,104 | 7/1978 | Muller | 318/138 |
| 4,115,715 | 9/1978 | Muller et al. | 310/68 B |
| 4,540,906 | 9/1985 | Blom | 310/67 R |
| 4,604,665 | 8/1986 | Muller et al. | 360/97 |
| 4,623,577 | 11/1986 | Hsiue et al. | 428/209 |
| 4,633,110 | 12/1986 | Genco et al. | 310/71 |
| 4,703,209 | 10/1987 | Wrobel | 310/67 R |
| 4,710,419 | 12/1987 | Gregory | 428/210 |
| 4,748,068 | 5/1988 | Fahner | 428/209 |
| 4,800,307 | 1/1989 | Papst | 310/67 R |

FOREIGN PATENT DOCUMENTS

| | | |
|---|---|---|
| 2415839 | 4/1974 | Fed. Rep. of Germany . |
| 7824009 | 8/1978 | Fed. Rep. of Germany . |
| 7909080 | 5/1979 | Fed. Rep. of Germany . |
| 8138692 | 10/1984 | Fed. Rep. of Germany . |
| 3427994 | 1/1986 | Fed. Rep. of Germany . |
| 8712486 | 9/1987 | Fed. Rep. of Germany . |
| 2300178 | 3/1978 | Japan . |
| 2245785 | 2/1985 | Japan . |

OTHER PUBLICATIONS

New Products, Hall Sensor Shares Power with IC Devices, Electronic Design 4-16-87.

Primary Examiner—Ellis P. Robinson
Assistant Examiner—P. J. Ryan
Attorney, Agent, or Firm—McCormick, Paulding & Huber

[57] ABSTRACT

A novel molded printed circuit board for use with a brushless electric motor is characterized by a surface having at least one integral portion thereof extending from the printed circuit board plane for establishing the interrelationship between the printed circuit board and at least one other motor component. When used in brushless motors, the printed circuit board provides a more precisely located triggering sensor for the commutation circuit and results in a motor better adapted for automated assembly.

11 Claims, 1 Drawing Sheet

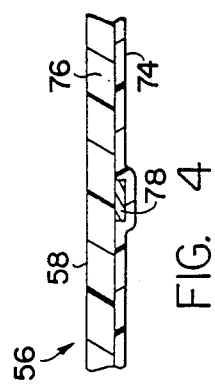
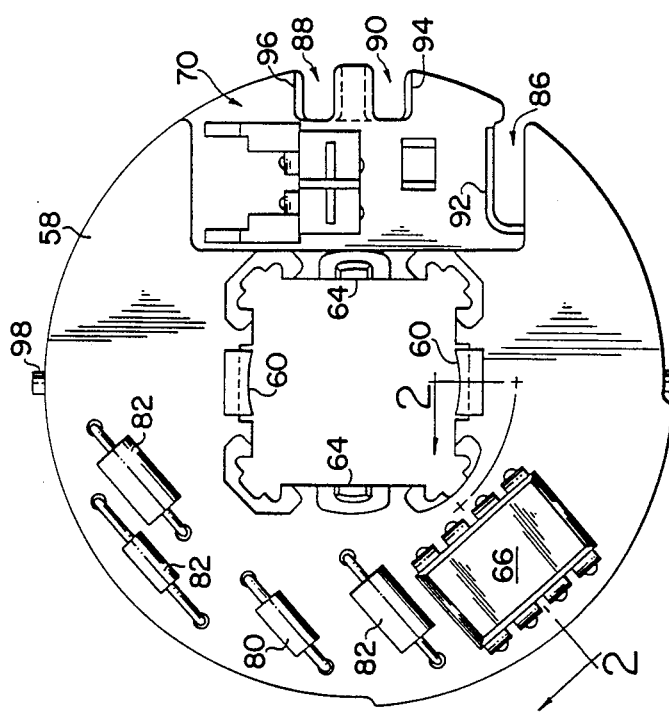
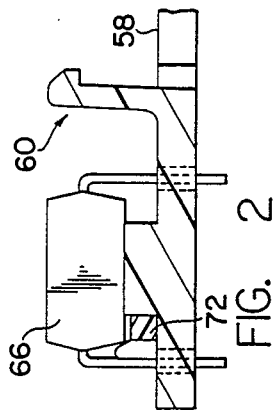
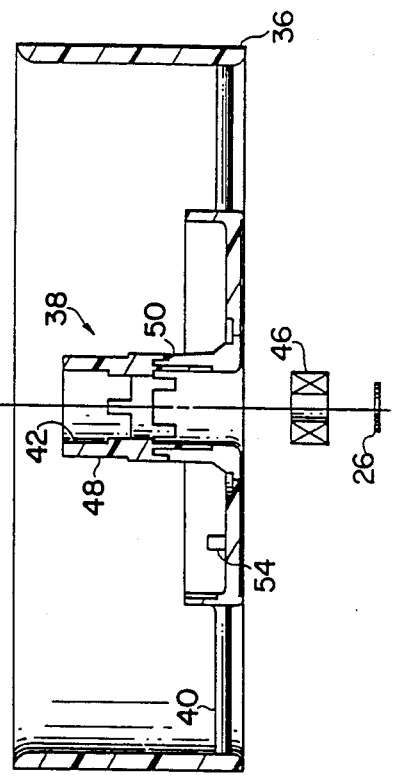

MOLDED PRINTED CIRCUIT BOARD FOR USE WITH A BRUSHLESS ELECTRIC MOTOR

TECHNICAL FIELD

This invention relates to a printed circuit board and more particularly to printed circuit boards used with brushless motors and characterized by at least one integral portion extending therefrom for locating the printed circuit board with at least one other component in an electric motor.

BACKGROUND OF THE INVENTION

Brushless electric motors are well known in the art and are characterized by internal electric circuitry which provides for electrical commutation. Brushless direct current (D.C.) motors are routinely produced in high volume for use in a multitude of industrial applications such as fan motors. As a result, it is imperative that the design of the motor be simple and adaptable to low cost automated assembly techniques.

Known brushless direct current motors include the electric fan motor No. TA 300 D.C. manufactured by the NIDEC Corporation of Torrington, CT. This motor includes a rotor having an external impeller and a housing. Concentric with the rotor is a stator and a printed circuit board, both mounted within the housing. On the printed circuit board is an electrical component which comprises a commutating circuit. The circuit contains a sensor, typicall a Hall cell, which is used as a trigger. These sensors are characterized by a limited range and therefore must be very carefully located with respect to the stator and the rotor. The printed circuit boards used conventionally with these motors are two dimensional and lack any intrinsic means for fixturing with other motor components. Consequently, the printed circuit board must be manually affixed within the housing in a position which will ensure that the sensor is located with respect to the other motor components within a precise range. The absence of any self-fixturing mechanism within known printed circuit boards also precludes the use of automated assembly techniques with respect to the printed circuit board, and ultimately limits the adoption of automated assembly techniques with respect to the other motor components as well.

To accomplish precise sensor location, known brushless electric motors using a conventional two dimensional printed circuit board require separate positioning of the sensor out of the plane of the printed circuit board. These motors are characterized by a separate pedestal or an equivalent that must be attached to the printed circuit board. A separate pedestal offers only marginal improvement in the accuracy of the sensor location and adds another labor intensive step to the motor assembly process.

It would be advantageous to have a printed circuit board for use in a brushless electric motor which includes a mechanism for self-fixturing with other motor components and which results in simplified assembly with other motor components, and which further would provide for a precisely located sensor. The present invention is drawn toward such a printed circuit board.

SUMMARY OF THE INVENTION

An object of the present invention is to provide for a printed circuit board characterized by an integral portion thereof for locating the printed circuit board with at least one other component in an electric motor.

Another object of the present invention is to provide a printed circuit board for use in a brushless motor which accurately positions electrical components of a commutation circuit with respect to other motor components.

Still another object of the present invention is to provide a printed circuit board for use with a brushless motor characterized by integral mechanisms for self-fixturing of the printed circuit board with other motor components.

An object of the present invention is to provide a printed circuit board for use with a brushless motor that can be configured to receive standard electrical components.

Still another aspect of the present invention is to provide a printed circuit board for use with a brushless motor characterized by a snap engaging mechanism for directly forming an assembly with at least one other motor component.

According to the present invention, a molded one piece printed circuit board for use in an electric motor having motor components includes a first layer with openings therein for providing electrical insulation. A plurality of conductors are also provided. Selected ones of the conductors register with corresponding ones of the openings. Also included is a second layer of molded plastic construction having an inner surface configured to receive the first layer and the conductors. The second layer has a plurality of openings registered with certain ones of the conductors and the first layer openings and further has an opposed outer surface with at least one integrally formed portion which is displaced from the remainder thereof. The displaced portion includes at least one precisely located surface for the accurate interrelationship of the printed circuit board with at least one other motor component.

According to another aspect of the present invention, a molded one piece printed circuit board for use in a motor having a stator and a rotor rotating about an axis comprises a first layer with openings therein for providing electrical insulation. A plurality of conductors is also included with selected ones that register with corresponding ones of the openings. Also provided is a second layer of molded plastic construction that has an inner surface configured to receive the first layer and the conductors. The second layer has a plurality of openings, registered with certain ones of the conductors and the first layer openings and further has an opposed outer surface with an integrally formed projection therefrom, said outer surface projection for locating the printed circuit board with the motor stator.

According to yet another aspect of the present invention, a molded one piece printed circuit board for use in a brushless electric motor having motor components, including a rotor and a stator characterized by an angular gap between adjacent magnetic poles of an electromagnet comprises a first layer for providing electrical insulation with openings therein. A plurality of conductors are included with selected ones that register with corresponding ones of the openings. A second layer of molded plastic construction is included having an inner surface configured to receive the first layer and the conductors. The second layer has a plurality of openings registered with certain ones of conductors and said first layer openings. The second layer further has an opposed outer surface when an integrally formed displaced portion thereof for fixedly locating one of the motor components from the remainder of said outer surface.

BRIEF DESCRIPTION OF THE DRAWINGS

FIG. 1 is an exploded sectioned illustration of a brushless electric motor which employs a printed circuit board provided according to the present invention.

FIG. 2 is a top illustration showing the printed circuit board of the motor of FIG. 1.

FIG. 3 is a side illustration of a portion of the printed circuit board of FIG. 2.

DESCRIPTION OF THE PREFERRED EMBODIMENT

Referring now to FIG. 1, there is shown an exploded sectioned illustration of a motor 10 having a printed circuit board provided according to the present invention. The motor 10 is of the type described and claimed in the copending, commonly owned U.S. patent application Ser. No. 225,089 entitled "A Brushless Electric Motor" incorporated herein by reference. A method of assembling such a motor is disclosed and claimed in the commonly owned, copending U.S. patent application Ser. No. 225,088 entitled "A Method of Assembling Brushless Electric Motors", and is also incorporated herein by reference.

The motor 10 includes an impeller 12 with a permanent magnet 14 fixed to an interior surface 16 of a rotor 18. The rotor has a centrally located shaft 20 along axis 22 about which the rotor will spin. At a distal end of the shaft is a groove 24 for receiving snap ring 26 used in a known manner for locating the rotor with respect to other motor components.

A stator 28 is concentric with the rotor and comprises a plastic support 30 adapted to receive a plurality of laminations 32. A support cover (not shown) of a known type can also be included. An opposed pair of electromagnets is formed in a known manner which includes laminations. The stator support is configured to have a central tubular opening and a plurality of electrical connectors 34 which extend from the stator support.

The motor 10 also comprises a housing 36 having a centrally located bearing tower 38 projecting from an inner housing surface 40. In the preferred embodiment, the housing and the bearing tower are integrally molded of plastic. The bearing tower is tubular and has an inner surface 42 adapted to receive bearings 44 and 46. The shaft is received by the bearings and affixed to the housing by the snap ring when the motor is completely assembled.

Additionally, the bearing tower has an outer surface 48 that has a recess 50. The stator support has a projection 52 extending toward the housing inner surface. The projection inner surface, together with the bearing tower recess comprise a snap engagement mechanism. It is preferable that the snap engagement mechanism is located adjacent to the housing inner surface.

Also included in the motor is a locating post 54 which is molded with the housing to extend from the inner surface. The post is configured to be in registration with an electrical element on a printed circuit board which contains a commutation circuit trigger sensor. The length of the post is selected to contact the printed circuit board and adjust or limit the displacement of the printed circuit board from the housing inner surface.

Since the sensor is positioned on the integral pedestal, the position of the sensor relative to the rotating magnet is controlled by the height of the post.

A printed circuit board 56 is also included in the motor for locating electrical components that comprise the requisite commutation circuitry. The printed circuit board in the preferred embodiment is molded and is characterized by one or more integral surfaces which depart from a plane 58 of the board. Although preferably generally planar, those skilled in the art will note that the printed circuit board can be nonplanar and can be formed to be received by other motor components, such as the housing. Nonplanar is defined to include surfaces which are arcuate throughout, or at least partially arcuate, as well as planar surfaces with at least a portion thereof which departs from the plane of the surface. Included by this definition therefore are printed circuit boards having a curved or planar surface where a portion departs from the remainder of the surface at an angle as well as curved or planar printed circuit boards which include a portion that is raised or recessed from the remainder of the surface. For example, a first projection 60 extends from the printed circuit board plane and further comprises an integral tab 62 at a distal end thereof. As detailed hereinafter, the tab comprises a mechanism for snap engagement to a cooperative element surface in the stator support.

Also extending from the surface of the printed circuit board is a second projection 64 which keys the printed circuit board to the stator so that the stator may receive the printed circuit board in only one relative position. The extending key is received by a cooperative element on the stator support and also prevents relative rotation of the printed circuit board with respect to the stator. Those skilled in the art will note that a stator and printed circuit board as described hereinabove can be directly assembled with each other to form a stator - printed circuit board assembly in which the tolerances of other motor components no longer effect the position of the sensor relative to the stator. As a direct consequence of the present stator and printed circuit board design, the amount of automated assembly possible for the motor is greatly increased. An example of an improved method of assembly for a brushless motor using the above stator - printed circuit board assembly is found in the above-referenced U.S. patent application entitled "A Method of Assembling Brushless Electric Motors".

Also shown in FIG. 1 is an integrated circuit 66 which preferably includes a sensor element, such as a Hall effect device. As is known in the art, a brushless motor comprises a commutation circuit including a sensor for detecting the passage of the rotating permanent magnet poles with respect to the poles of a stator electromagnet for triggering the commutation circuitry. In known brushless motors, such as the motor 10, the Hall effect device is a discrete element manually positioned relative to the surface of the printed circuit board so that when the motor is assembled, the device is positioned at a precise angular location with respect to the stator permanent magnet poles and spaced from the stator poles within a preestablished range.

With a printed circuit board according to the present invention, the board is molded such that a portion thereof is raised from the surface 58 so that the sensor will be properly positioned when the printed circuit board is assembled with the stator. This is accomplished in the preferred embodiment by the fabrication of the printed circuit board with an integral pedestal 68. The printed circuit board also includes another substantially planar portion 70 recessed from the plane 58 of the printed circuit board. The recessed portion is configured to be at a depth from the plane such that a standard electrical component, such as a connector, can be used. Without such a recessed portion the use of inexpensive electrical components is not possible. Instead, electrical leads must be manually soldered to the printed circuit board.

The present molded printed circuit board provides (1) self-fixturing of the printed circuit board with other motor components, (2) accurate positioning of components such as a sensor, integrated circuit or connector and (3) allows for the use of inexpensive electrical components without modification to the existing stator, since the clearance between the receiving portion of the printed circuit board and the stator can be custom selected and incorporated into the printed circuit board mold. In contrast, known printed circuit boards used in brushless motors simply provide two dimensional location of electrical elements such as resistors, capacitors and integrated circuits.

Also shown in FIG. 1 and detailed in FIG. 2 is a pedestal standoff 72 molded to comprise an outer radial portion of the pedestal. The outer radial standoff 72 is integral with the pedestal, and is included to provide for more precise radial positioning of the sensor or sensor containing element, such as integrated circuit 66, and prevents portions of the rotor from rubbing on the integrated circuit as it rotates.

Referring now to FIGS. 3 and 4, there is shown a top planar view of the surface 58 (FIG. 3) and a sectioned illustration of a portion of the printed circuit board 56 (FIG. 4). As is shown in FIG. 4, the printed circuit board is multilayered, comprising opposed first and second layers 74 and 76, with a plurality of electrical conductors, formed therebetween. The first layer is electrically insulating and is configured on a second layer inner surface and the conductors. In FIG. 1, post 54 contacts the first layer. The conductors, such as conductor 78 comprise deposited metal formed in a conventional manner. Other known fabrication techniques for electrically configuring the present printed circuit board include those used in making "flexible" printed circuit boards and printed circuit boards made with conductive plastics.

The present invention is readily adapted to those applications which require nonplanar surfaces or connectors. For example, the printed circuit board 56 can be molded with appropriately curved surfaces to be directly received by the housing, or can be molded as part of the housing. Moreover, in certain motors or with certain sensors, the height of the pedestal 68 may be such that the lead length of standard electrical components (e.g. integrated circuit 66) is insufficient to extend through layer 76 and the conductors thereto must be extended through the layer 76. Typically, this is accomplished by a known throgh plating process.

Surface 58 is an outer surface of the second layer. Electrical components, such as resistors 80, diodes 82 and integrated circuit 66 contact selected ones of the conductors and comprise a commutation circuit. The printed circuit board first projection 60 is shown along with the key 64 about a central opening in the printed circuit board.

Recessed portion 70 is detailed in FIG. 3 and is configured in the preferred embodiment to receive a connector 84 shown in FIG. 1. The connector is configured so that the electrical wires (not shown) needed for connection to an external power source will pass through an opening 86. Other electrical wires pass through openings 88,90. It is preferable that the openings be provided with a chamfered edge 92,94,96 to provide a a strain relief for the electrical wires. Also shown in FIG. 3 are integral attachment tabs 98 which extend outwardly from the printed circuit board. The tabs connect adjacent printed circuit boards. Moreover, the tabs maintain the printed circuit boards in an array during subsequent motor assembly.

Similarly, although the invention has been described hereinabove with respect to a preferred embodiment thereof, those skilled in the art will note that certain substitutions, deletions and additions thereto can be made therein without departing from the spirit and scope of the present invention.

We claim:

1. A molded one piece printed circuit board for use in a motor having a stator having a plurality of attachment means spaced thereabout and a rotor rotating about an axis, said printed circuit board comprising:
   a first layer with openings therein for providing electrical insulation;
   a plurality of conductors, selected ones of which register with corresponding ones of said openings; and
   a second layer of molded plastic construction having an inner surface configured to receive said first layer and said conductors, said second layer having a plurality of openings registered with certain ones of said conductors and said first layer openings, and further having an opposed outer surface with a plurality of integrally formed projections therefrom spaced thereabout, said projections configured to be in registration with and adapted to be received by said stator attachment means, said second layer projections configured to affix the printed circuit board to said stator in a preferred alignment and preclude relative movement therebetween.

2. The printed circuit board of claim 1 wherein said printed circuit board second layer projections are generally axial and further comprises a first snap engagement means adjacent the free end portion thereof, said stator projections having a complementary second snap engagement means for cooperation with said printed circuit board snap engagement means.

3. The printed circuit board of claim 2 wherein said first and second snap engagement means each comprises a tab.

4. The printed circuit board of claim 2 wherein said second layer second projection is configured such that the stator is affixed to the printed circuit board to preclude relative rotation therebetween about an axis substantially perpendicular to the rotor axis.

5. A molded one piece printed circuit board for use in a brushless electric motor having motor components including an annular stator with a central tubular support means having a plurality of receptacle means spaced about an outer perimeter surface thereof and a rotor coaxial therewith rotating about an axis, said stator characterized by an angular gap between adjacent magnetic poles of an electromagnet, said printed circuit board comprising:
   a first layer with openings therein for providing electrical insulation;

a plurality of conductors, selected ones of which register with corresponding ones of said openings; and a single second layer of molded plastic construction having an inner surface configured to receive said first layer and said conductors, said second layer having a plurality of openings registered with certain ones of said conductors and said first layer openings, and further having an opposed outer surface with a plurality of integrally formed projections therefrom spaced about a peripheral surface of a inner central opening in the printed circuit board, said projections configured to be in registration with and adapted to be received by said stator receptacle means, said second layer projections respectively configured to affix the printed circuit board to said stator in a preferred alignment and preclude relative movement therebetween.

6. The printed circuit board of claim 5 wherein said motor components include a means for sensing relative angular position of the rotor with respect to said gap, said printed circuit board outer surface portion further comprising an integral pedestal projection therefrom for fixedly positioning said sensing means at a selected angular and spaced location relative to said gap.

7. The printed circuit board of claim 6 wherein said motor component fixedly located relative to said gap includes an integrated circuit.

8. The printed circuit board of claim 7 wherein said pedestal projection further includes a tab means projecting radially from said pedestal for providing radial positioning of said integrated circuit.

9. The printed circuit board of claim 6 wherein the motor components include a discrete electrical connector and wherein said printed circuit board second layer includes a recessed planar portion configured to receive said discrete electrical connector.

10. The printed circuit board of claim 9 wherein said discrete electrical connector includes an electrical wire and wherein said printed circuit board second layer further comprises an opening extending inward from an outer peripheral edge of said printed circuit board, said opening bounded by at least one edge having a chamfer for providing strain relief for aid electrical wire passing between said outer layer and said first layer.

11. The printed circuit board of claim 6 wherein said stator attachment means comprises a projecting tab.

* * * * *